United States Patent
Yamada et al.

(10) Patent No.: US 9,728,475 B2
(45) Date of Patent: Aug. 8, 2017

(54) LEAD PORTION OF SEMICONDUCTOR DEVICE

(71) Applicant: FUJI ELECTRIC CO., LTD., Kawasaki-shi (JP)

(72) Inventors: Tadanori Yamada, Matsumoto (JP); Toshio Denta, Matsumoto (JP); Tomonori Seki, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/086,774

(22) Filed: Mar. 31, 2016

(65) Prior Publication Data

US 2016/0211202 A1    Jul. 21, 2016

Related U.S. Application Data

(60) Division of application No. 14/645,828, filed on Mar. 12, 2015, now Pat. No. 9,406,576, which is a
(Continued)

(30) Foreign Application Priority Data

Nov. 19, 2012 (JP) .................................. 2012-253403

(51) Int. Cl.
*H01L 23/495* (2006.01)
*H01L 23/057* (2006.01)
(Continued)

(52) U.S. Cl.
CPC ........ *H01L 23/057* (2013.01); *H01L 23/4952* (2013.01); *H01L 23/49541* (2013.01);
(Continued)

(58) Field of Classification Search
CPC ... H01L 23/057; H01L 23/4952; H01L 24/85; H01L 23/49541; H01L 23/50;
(Continued)

(56) References Cited

U.S. PATENT DOCUMENTS 4,142,203 A    2/1979  Dietz
5,389,739 A    2/1995  Mills
(Continued)

FOREIGN PATENT DOCUMENTS

EP    2814060 A1    12/2014
JP    S56-074948 A   6/1981
(Continued)

OTHER PUBLICATIONS

Office Action issued in Japanese Appln. No. 2014-546840 mailed Apr. 12, 2016. English translation provided.
(Continued)

*Primary Examiner* — Jarrett Stark
*Assistant Examiner* — Shahed Ahmed
(74) *Attorney, Agent, or Firm* — Rossi, Kimms & McDowell LLP (57) ABSTRACT

A miniaturized semiconductor device includes a frame body having an opening region formed in a central portion, an insulating substrate which is provided in the opening region of the frame body and on which semiconductor chips are mounted, lead portions, each including an inclined portion that is at least partially exposed to the opening region formed in the frame body and extends so as to be inclined with respect to an end surface forming the opening region, and a bonding wire that is bonded between the lead portion and the semiconductor chip by ultrasonic bonding.

7 Claims, 4 Drawing Sheets

Related U.S. Application Data continuation of application No. PCT/JP2013/004614, filed on Jul. 30, 2013.

(51) Int. Cl.
*H01L 23/50* (2006.01)
*H01L 25/07* (2006.01)
*H01L 23/00* (2006.01)

(52) U.S. Cl.
CPC ........ *H01L 23/49548* (2013.01); *H01L 23/50* (2013.01); *H01L 24/45* (2013.01); *H01L 24/85* (2013.01); *H01L 24/48* (2013.01); *H01L 25/072* (2013.01); *H01L 2224/45* (2013.01); *H01L 2224/48137* (2013.01); *H01L 2224/48247* (2013.01); *H01L 2224/85205* (2013.01); *H01L 2924/00014* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)

(58) Field of Classification Search
CPC ................. H01L 24/45; H01L 2224/45; H01L 2224/48137; H01L 2224/48247
USPC ........ 257/666, 672, 676, 690; 438/112, 106, 438/123
See application file for complete search history.

(56) References Cited

U.S. PATENT DOCUMENTS

| | | | | |
|---|---|---|---|---|
| 6,064,115 | A * | 5/2000 | Moscicki | ............ H01L 23/4334 257/675 |
| 8,586,480 | B1 | 11/2013 | Zommer | |
| 2004/0080026 | A1 * | 4/2004 | Minamio | .............. H01L 21/565 257/666 |
| 2005/0231925 | A1 | 10/2005 | Fukuda et al. | |
| 2013/0015567 | A1 * | 1/2013 | Minamio | ............ H01L 23/4334 257/676 |
| 2014/0042624 | A1 * | 2/2014 | Zommer | ................. H01L 24/03 257/741 |
| 2014/0374889 | A1 | 12/2014 | Denta et al. | |

FOREIGN PATENT DOCUMENTS

| | | | |
|---|---|---|---|
| JP | 6230498 | B2 | 7/1987 |
| JP | 0201933 | A | 1/1990 |
| JP | 02277257 | A | 11/1990 |
| JP | H03177055 | A | 8/1991 |
| JP | 56852 | U | 1/1993 |
| JP | H1084009 | A | 3/1998 |
| JP | H11-026670 | A | 1/1999 |
| JP | 2005353742 | A | 12/2005 |
| JP | 2006147908 | A | 6/2006 |
| JP | 2007306748 | A | 11/2007 |
| JP | 2011253942 | A | 12/2011 |

OTHER PUBLICATIONS

Extended European Search Report issued in European Appln. No. 13855961.2 mailed May 30, 2016.
International Search Report issued in Intl. Appln. No. PCT/JP2013/004614, mailed Nov. 5, 2013.
Office Action issued in U.S. Appl. No. 14/645,828, mailed Sep. 17, 2015.
Notice of Allowance issued in U.S. Appl. No. 14/645,828, mailed Feb. 12, 2016.
Office Action issued in Chinese Patent Application No. 201380048132.5 mailed Nov. 30, 2016. English translation provided.

* cited by examiner

LEAD PORTION OF SEMICONDUCTOR DEVICE

CROSS-REFERENCE TO RELATED APPLICATIONS

This application is a continuation of International Application No. PCT/JP2013/004614, filed on Jul. 30, 2013, and is based on and claims priority to Japanese Patent Application No. JP 2012-253403, filed on Nov. 19, 2012. The disclosure of the Japanese priority application and the PCT application in their entirety, including the drawings, claims, and the specification thereof, are incorporated herein by reference.

BACKGROUND

Field

Embodiments of the present invention provide a semiconductor device, such as a power device or a high-frequency switching integrated circuit (IC), in which an insulating substrate having a semiconductor chip mounted thereon is provided in an opening region formed in a frame body and a lead portion formed in the frame body is connected to the semiconductor chip by a bonding wire.

Discussion of the Background

In general, in a power device, such as a power conversion inverter device, or a high-frequency switching IC, an insulating substrate on which a semiconductor chip having an insulated gate bipolar transistor (IGBT) or a power metal-oxide-semiconductor field-effect transistor (MOSFET) as a switching element or a semiconductor chip, such as a free-wheeling diode (FWD), is mounted is provided in an opening region formed in a frame body.

An electronic device disclosed in Japanese Publication JP 2005-353742 A has been proposed as the semiconductor device. In the electronic device disclosed in Japanese Publication JP 2005-353742 A, a control unit and a driving unit which form the electronic device are mounted on a mounting surface of an island portion of a lead frame. The control unit and the driving unit are electrically connected to first and second lead portions of the lead frame through bonding wires, respectively. The control unit, the driving unit, each bonding wire, the island portion, and the first and second lead portions are sealed by a molding resin. Here, each of the first and second lead portions includes a rectangular pad portion to which the bonding wire is bonded and an elongated external connection portion which is connected to the rectangular pad portion.

In Japanese Publication JP 2006-147908 A, an inner lead frame which is supported by an insulating material is provided in an external lead frame supported by a supporting member, and a semiconductor chip is mounted on the inner lead frame and is connected to the inner frame and an external frame by a bonding wire. Here, the external frame includes a circular portion for bonding the bonding wire and a lead portion which is connected to the circular portion.

SUMMARY

However, in the device according to the related art disclosed in Japanese Publication JP 2005-353742 A, the lead portion is arranged such that a predetermined space is formed between the inner end thereof and the island portion. Therefore, there is an unsolved problem that the size of the overall structure is increased by a value corresponding to the predetermined space, and it is difficult to respond to a demand for miniaturization. In addition, in the device according to the related art disclosed in Japanese Publication JP 2006-147908 A, similarly to the device disclosed in Japanese Publication JP 2005-353742 A, the external lead frame is arranged such that a predetermined space is formed between the inner end thereof and the external end of the inner lead frame. Therefore, there is an unsolved problem that the size of the overall structure is increased by a value corresponding to the predetermined space, and it is difficult to respond to a demand for miniaturization. Embodiments of the invention provide a semiconductor device which can be miniaturized.

According to a first aspect of the invention, a semiconductor device includes a frame body having an opening region formed in a central portion, an insulating substrate which is provided in the opening region of the frame body and on which a semiconductor chip is mounted, a lead portion including an inclined portion that is at least partially exposed to the opening region formed in the frame body and extends so as to be inclined with respect to an end surface forming the opening region, and a bonding wire that is bonded between the lead portion and the semiconductor chip by ultrasonic bonding.

According to a second aspect of the invention, in the semiconductor device, the inclined portion may extend in a direction in which a vibration component is suppressed during the ultrasonic bonding of the bonding wire. According to a third aspect of the invention, in the semiconductor device, the lead portion may include a movement restriction portion that is formed on a side opposite to the opening region and restricts the movement of the lead portion to the outside of the frame body. The frame body may include a receiving portion that is fitted to the movement restriction portion.

According to a fourth aspect of the invention, in the semiconductor device, the lead portion may include a parallelogram region having inclined end surfaces that intersect the end surface forming the opening region and are parallel to each other and a terminal portion that protrudes and extends from one side of the parallelogram region which is opposite to the opening region to the outside of the frame body. According to a fifth aspect of the invention, in the semiconductor device, the lead portion may include: an inclined portion including an inclined end surface that extends from the end surface forming the opening region and intersects the end surface and an orthogonal end surface that is perpendicular to the end surface; and a step portion that is formed on a side of the orthogonal end surface opposite to the opening region and restricts the movement of the lead portion to the outside of the frame body.

According to a sixth aspect of the invention, in the semiconductor device, in the lead portion, at least one side which intersects the end surface forming the opening region may be formed in a dogleg end surface, thereby forming the inclined portion. According to a seventh aspect of the invention, in the semiconductor device, in the lead portion, one of two sides which intersect the end surface forming the opening region may be formed in a dogleg end surface and the other side may be formed in an end surface perpendicular to the end surface, thereby forming the inclined portion.

According to an eighth aspect of the invention, in the semiconductor device, in the lead portion, two sides which intersect the end surface forming the opening region may be formed in dogleg end surfaces that are curved in the same direction, thereby forming the inclined portion. According to a ninth aspect of the invention, in the semiconductor device, in the lead portion, two sides which intersect the end surface forming the opening region may be formed in curved end surfaces that are curved in the same direction, thereby forming the inclined portion. According to a tenth aspect of the invention, in the semiconductor device, in the lead portion, the inclined portion may be a bonding wire bonding portion.

According to an eleventh aspect of the invention, a semiconductor device includes a frame body having an opening region formed in a central portion, an insulating substrate which is provided in the opening region of the frame body and on which a semiconductor chip is mounted, a lead portion including a plate portion that is at least partially exposed to the opening region formed in the frame body and extends in a direction in which the plate portion intersects an end surface forming the opening region and an uneven portion that is formed on at least one side of the plate portion, and a bonding wire that is bonded between the lead portion and the semiconductor chip by ultrasonic bonding. According to a twelfth aspect of the invention, in the semiconductor device, the uneven portion may extend in a direction in which a vibration component is suppressed during the ultrasonic bonding of the bonding wire.

According to embodiments of the invention, when vibration is applied to a lead portion at the time the lead portion and a semiconductor chip are connected to each other by ultrasonic bonding using a bonding wire, it is possible to suppress a vibration component in the direction in which an inclined portion or a concave portion extends. Even when the lead portion is exposed to an opening region, it is possible to perform ultrasonic bonding with high accuracy. Therefore, the lead portion can be formed so as to lean to the inside, as compared to when the inner end of the lead portion is arranged at a position that is away from the opening region to the outside so as not to be affected by the influence of vibration during ultrasonic bonding. As a result, it is possible to reduce the size of the overall structure.

DETAILED DESCRIPTION OF ILLUSTRATED EMBODIMENTS

Figure 1:
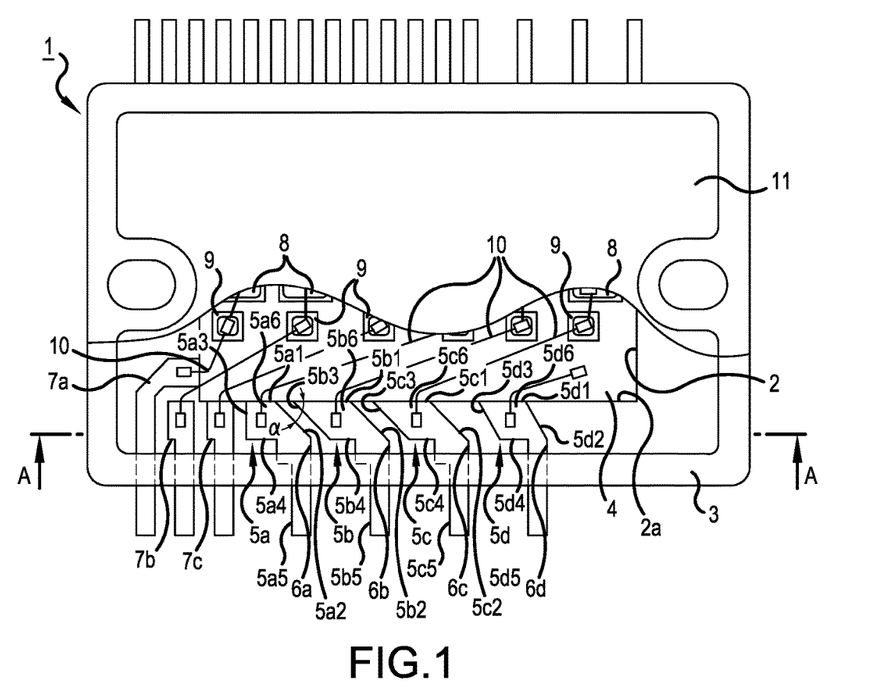
FIG. 1 is a plan view illustrating a semiconductor device according to a first embodiment of the invention, in which a portion of the semiconductor device is not illustrated.
Figure 2:
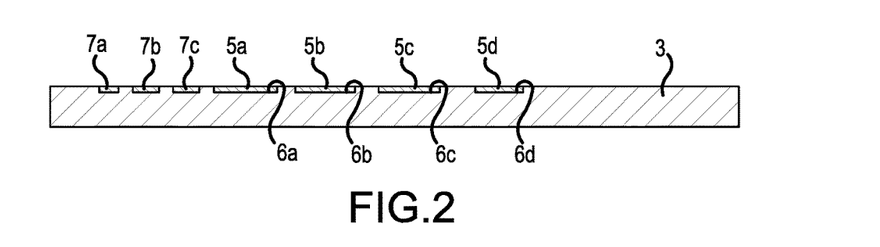
FIG. 2 is a cross-sectional view taken along the line A-A of FIG. 1.

Hereinafter, embodiments of the invention will be described with reference to the drawings. FIG. 1 is a plan view illustrating a semiconductor device according to a first embodiment of the invention, in which a portion of the semiconductor device is not illustrated, and FIG. 2 is a cross-sectional view taken along the line A-A of FIG. 1. A semiconductor device 1 has, for example, a rectangular shape in a plan view and includes a frame body 3 which is made of, for example, a synthetic resin and has a rectangular opening region 2 formed at the center and an insulating substrate 4 which is made of, for example, electrical and/or heat insulating materials, such as ceramic, aluminum, etc., and is provided in the opening region 2 of the frame body 3.

In the frame body 3, a plurality of lead portions, for example, four lead portions 5a to 5d with a thickness of about 0.3 mm to 0.6 mm are provided in accommodation grooves 6a to 6d, respectively, which have a shape corresponding to the shape of the lead portion, so as to be exposed to the opening region 2. Here, the lead portion 5a includes an opening end surface 5a1 which is exposed to the opening region 2, an inclined end surface 5a2 which is inclined and extends in the lower right direction of FIG. 1 at an inclination angle α of, for example, 45 degrees with respect to an end surface 2a forming the opening region 2, an orthogonal end surface 5a3 which extends vertically to the end surface 2a formed on the left side of the inclined end surface 5a2, a plurality of step portions 5a4 which are formed at the outer end of the orthogonal end surface 5a3, and a thin external connection terminal portion 5a5 which is connected to the final step portion among the step portions 5a4 and the outer end of the inclined end surface 5a2. A region which is surrounded by the opening end surface 5a1, the inclined end surface 5a2, the orthogonal end surface 5a3, and the step portions 5a4 is an inclined portion 5a6.

The lead portions 5b to 5c have the same structure as the lead portion 5a except that the orthogonal end surface 5a3 of the lead portion 5a is omitted and a parallelogram is formed by inclined end surfaces 5b3 to 5d3 parallel to inclined end surfaces 5b2 to 5d2, respectively, instead of the orthogonal end surface 5a3. However, for the lead portion 5d, the inclination angle of the inclined end surfaces 5d2 and 5d3 is set to about 60 degrees with respect to the end surface 2a in the lower right direction of FIG. 1.

The lead portion 5d has the same shape as the lead portions 5b and 5c except for the number of step portions 5d4. For example, the number of step portions 5b4 or 5c4 is two or more, and the number of step portions 5d4 is one.

In addition to the lead portions 5a to 5d, three lead portions 7a to 7c are formed in the frame body 3.

The lead portions 5a to 5d are respectively arranged in the accommodation grooves 6a to 6d formed in the frame body 3 so as not to come off to the opening region 2.

A predetermined number of semiconductor chips 8, each having a switching element, such as an insulated gate bipolar transistor (IGBT) or a power MOSFET, and a predetermined number of semiconductor chips 9, each having a free-wheeling diode (FWD) that is connected in inverse parallel to the switching element of the semiconductor chip 8, are provided in parallel on the insulating substrate 4. The semiconductor chips 8 and 9, and the lead portions 5a to 5d and 7a to 7c are electrically bonded to each other by bonding wires 10. For the lead portions 5a to 5d, the inclined portions 5a6 to 5d6 are used as pads for ultrasonic bonding using the bonding wires 10. The bonding wire 10 is bonded by an ultrasonic welder. The head of the ultrasonic welder comes into contact with the lead portions 5a to 5d and vibrates in a direction perpendicular to the end surface 2a, that is, the front-rear direction in the plan view of FIG. 1 to perform welding.

In the ultrasonic bonding, when a vibration force in the front-rear direction is transmitted to each of the lead portions 5a to 5d, the lead portions 5a to 5d may be separated from the grooves 6a to 6d and move into the opening region 2. However, the inclined end surface 5a2 of the lead portion 5a is inclined at an angle of 45 degrees in the lower right direction and the lead portions 5a to 5d each include the step portion 5a4 serving as a movement restriction portion for restricting the movement of the lead portions 5a to 5d to the outside of the frame body 3. Therefore, component force in a direction in which the inclined portion 5a6 comes off to the opening region 2 due to the vibration force of the ultrasonic welder in the front-rear direction is reduced, and it is possible to reliably prevent the lead portion 5a from coming off to the opening region 2 due to the vibration force during ultrasonic bonding.

For the lead portions 5b to 5d, the inclined portions 5b6 to 5d6 have a parallelogram shape formed by the respective inclined end surfaces 5b2 to 5d2 and 5b3 to 5d3 which are inclined in the lower right direction. Therefore, similarly to the lead portion 5a, it is possible to reliably prevent the inclined portions 5b6 to 5d6 from coming off to the opening region 2 due to the vibration force of the ultrasonic welder in the front-rear direction. In addition, even when the lead portions 5a to 5d have a relatively small thickness of 0.3 mm to 0.6 mm, they do not vibrate during ultrasonic bonding, and it is possible to stably perform bonding. Since the inclined end surfaces 5a2 to 5c2, 5b3, and 5c3 of the lead portions 5a to 5c are inclined in the same direction, adjacent lead portions 5a to 5c can be arranged at equal intervals.

Therefore, it is possible to reduce the gap between adjacent lead portions 5a to 5c and thus to reduce the size of the overall structure. As such, in the first embodiment, the lead portions 5a to 5d can be formed at a position close to the opening region 2 so as to have the opening end surfaces 5a1 to 5d1 exposed to the opening region 2. Therefore, it is not necessary to form a space region between the lead portion and the opening region 2, unlike the related art. As a result, it is possible to reduce the size of the overall structure by a value corresponding to the space region.

In the first embodiment, the inclination angle of the inclined end surface forming the inclined portions 5a6 to 5d6 is set to 45 degrees or 60 degrees in the lower right direction (clockwise direction). However, the invention is not limited thereto. The inclination angle may be set to any value in the range of 10 degrees to 80 degrees in the lower right direction (clockwise direction). In this case, when the inclination angle is less than 10 degrees, the gap between adjacent lead portions is small and it is difficult to ensure the width of the lead portion. When the inclination angle is greater than 80 degrees, force to restrict movement due to the vibration force during ultrasonic bonding is reduced and it is difficult to perform stable ultrasonic bonding. In addition, the inclination angle α of the inclined end surface of each of the lead portions 5a to 5d may be inclined in the lower left direction (counterclockwise direction), instead of being inclined to the lower right direction (clockwise direction).

Figure 3:
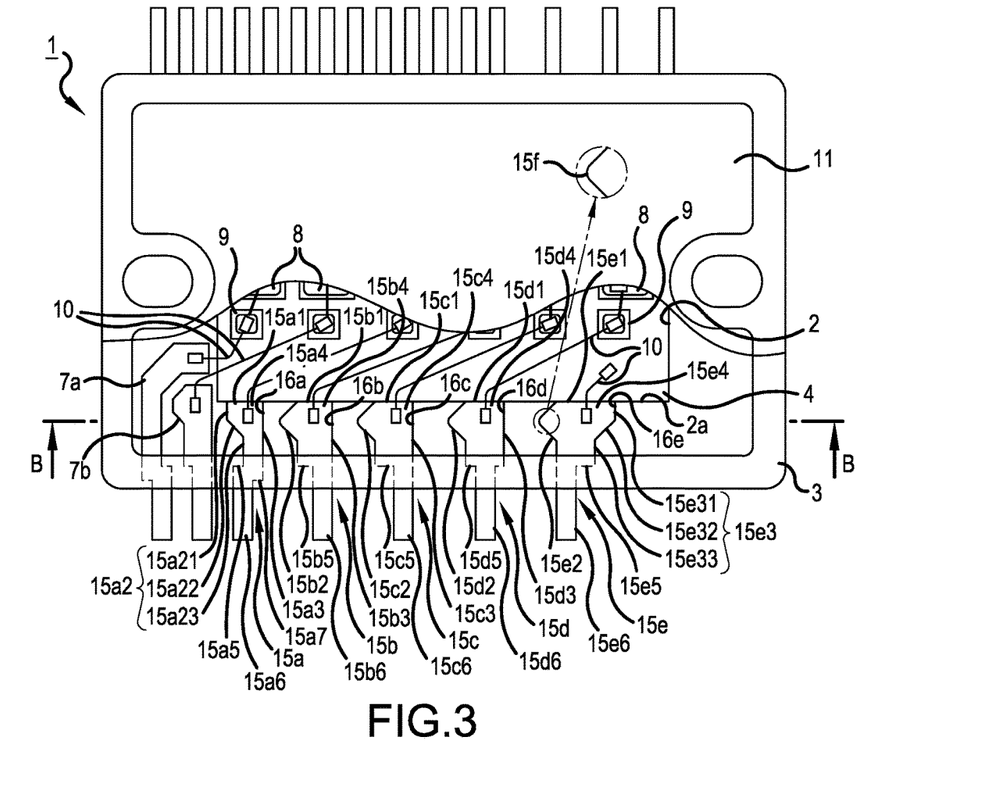
FIG. 3 is a plan view illustrating a semiconductor device according to a second embodiment of the invention, in which a portion of the semiconductor device is not illustrated.
Figure 4:
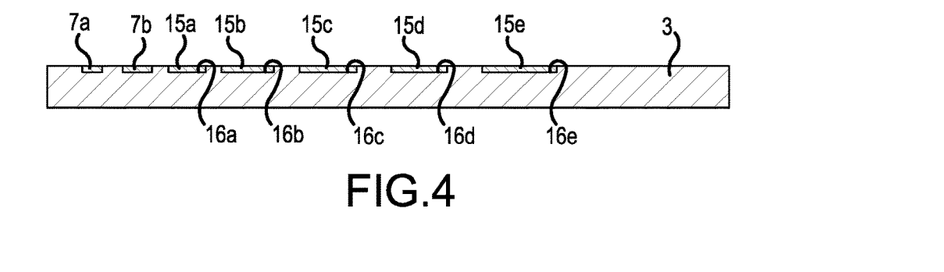
FIG. 4 is a cross-sectional view taken along the line B-B of FIG. 1.

Next, a second embodiment of the invention will be described with reference to FIG. 3. In the second embodiment, the shape of an inclined portion of each of lead portions 5a to 5d is changed. That is, in the second embodiment, as illustrated in FIG. 3, one of the end surfaces of each of five lead portions 15a to 15e which intersect an end surface 2a forming an opening region 2 is formed into dogleg end surfaces 15a2 to 15e2, respectively.

The left side of the lead portion 15a includes an end surface 15a2 having two dogleg shapes formed by an orthogonal end surface portion 15a21 which is perpendicular to the end surface 2a at a position exposed to the end surface 2a, an inclined end surface portion 15a22 which is inclined from the rear end of the orthogonal end surface portion 15a21 in the front right direction, and an orthogonal end surface portion 15a23 which extends forward from the leading end of the inclined end surface portion 15a22. The other side of the lead portion 15a is an orthogonal end surface 15a3 which is perpendicular to the end surface 2a. A region which is surrounded by the dogleg end surface 15a2, the orthogonal end surface 15a3, and the opening end surface 15a1 is an inclined portion 15a4 having an inclined end surface. In addition, a step portion 15a5 which is parallel to the opening end surface 15a1 is formed from the leading end of the dogleg end surface 15a2. A step portion 15a7 which is parallel to the opening end surface 15a1 is formed from the leading end of the orthogonal end surface 15a3. An external connection terminal portion 15a6 is formed at the leading ends of the step portion 15a5 and the step portion 15a7. The step portion 15a5 can suppress the movement of the lead portion 15a to the opening region 2 due to vibration which is generated during the ultrasonic bonding of bonding wires and is applied to the lead portion 15a in the front-rear direction. The step portion 15a7 can suppress the movement of the lead portion 15a to the outside of a frame body 3.

On one side of each of the lead portions 15b to 15d which is perpendicular to the end surface 2a forming the opening region 2, a central portion in the front-rear direction protrudes toward the outside and dogleg end surfaces 15b2 to 15d2 are formed, as compared to the lead portion 15a. Regions which are surrounded by the dogleg end surfaces 15b2 to 15d2, the orthogonal end surfaces 15b3 to 15d3, and the opening end surfaces 15b1 to 15d1 are inclined portions 15b4 to 15d4 having inclined end surfaces, respectively. In addition, step portions 15b5 to 15d5 are formed at the leading ends of the dogleg end surfaces 15b2 to 15d2, respectively. External connection terminal portions 15b6 to 15d6 are formed at the right ends of the step portions 15b5 to 15d5 and on the extension lines of the orthogonal end surfaces 15b3 to 15d3. The step portions 15b5 to 15d5 can restrict the movement of the lead portions 15b to 15d to the outside of the frame body 3, respectively.

The lead portion 15e includes an inclined end surface 15e3 including an orthogonal end surface 15e31 which is provided at the position where the orthogonal ends 15b3 to 15d3 of the lead portions 15b to 15d are exposed to the end surface 2a, an inclined end surface 15e32 which extends from the leading end of the orthogonal end surface 15e31 to the front left side, and an orthogonal end surface 15e33 which extends forward from the leading end of the inclined end surface 15e32 in parallel to the orthogonal end surface 15e31. A region which is surrounded by the inclined end surface 15e3, the dogleg end surface 15e2, and the opening end surface 15e1 is an inclined portion 15e4 having an inclined end surface. In addition, a step portion 15e5 is formed at the leading end of the inclined end surface 15e3. An external connection terminal portion 15e6 is formed so as to extend forward from the left end of the step portion 15e5 and the leading end surface of the dogleg end surface 15e2.

As illustrated in the enlarged view of the lead portion 15e in FIG. 3, an R-chamfered portion 15f is formed at the apex of the central portion of each of the dogleg end surfaces 15b2 to 15e2 of the lead portions 15b to 15e. As such, when the R-chamfered portion 15f is formed, it is possible to prevent discharge between adjacent lead portions. In addition, it is easy for a resin sealing material 11 to flow into a mold during resin molding and it is possible to prevent the insufficient filling of the molding resin in, for example, a short mold.

The lead portions 15a to 15e are accommodated in accommodation grooves 16a to 16e formed in the frame body 3, respectively. The other structures are the same as those in the first embodiment. Therefore, components corresponding to those illustrated in FIG. 1 are denoted by the same reference numerals and the detailed description thereof will not be repeated. According to the second embodiment, the dogleg end surfaces 15a2 to 15e2 are formed in the lead portions 15a to 15e, respectively. Therefore, the dogleg end surfaces 15a2 to 15e2 can reliably prevent the movement of the lead portions 15a to 15e in the front-rear direction during ultrasonic bonding. As a result, it is possible to obtain the same operation and effect as those in the first embodiment.

Figure 5A:
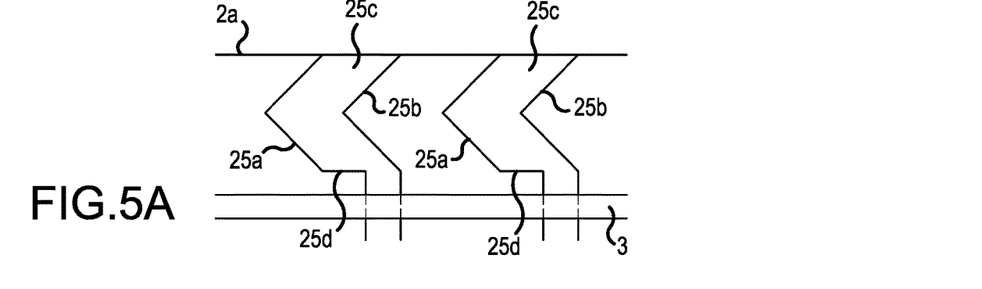
FIGS. 5A, 5B, 5C, and 5D are diagrams illustrating modifications of a lead portion.

In the first and second embodiments, the inclined portion includes the inclined end surface or the dogleg end surface. However, the invention is not limited to the above-mentioned structure. As illustrated in FIGS. 5A-D and 6A-F, the inclined portion may have various shapes. That is, as illustrated in FIG. 5A, a pair of dogleg end surfaces 25a and 25b which protrude in the same direction may be provided to form an inclined portion 25c, and a step portion 25d may be formed.

Figure 5B:
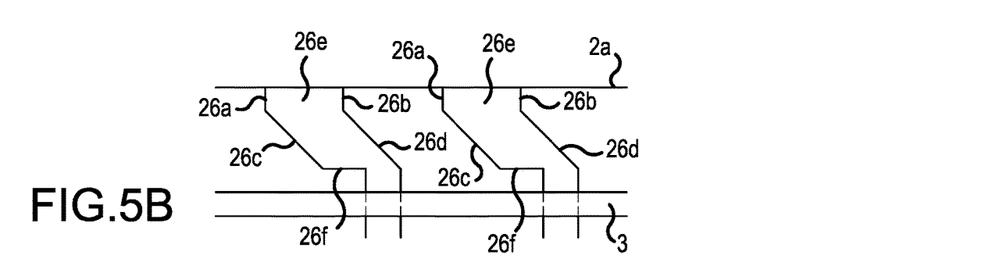

As illustrated in FIG. 5B, a dogleg inclined portion 26e may be formed by relatively short orthogonal end surfaces 26a and 26b which are exposed to the end surface 2a forming the opening region 2 and are perpendicular to the end surface 2a and inclined end surfaces 26c and 26d which obliquely extend from the leading ends of the orthogonal end surfaces 26a and 26b to the front right side, respectively, and a step portion 26f may be formed.

Figure 5C:
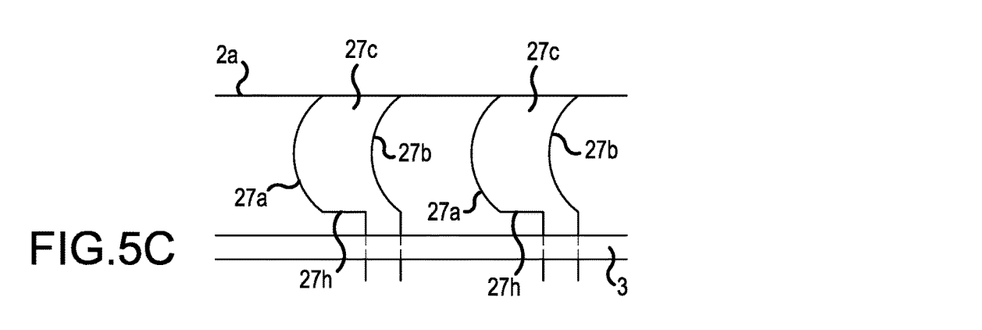
Figure 5D:
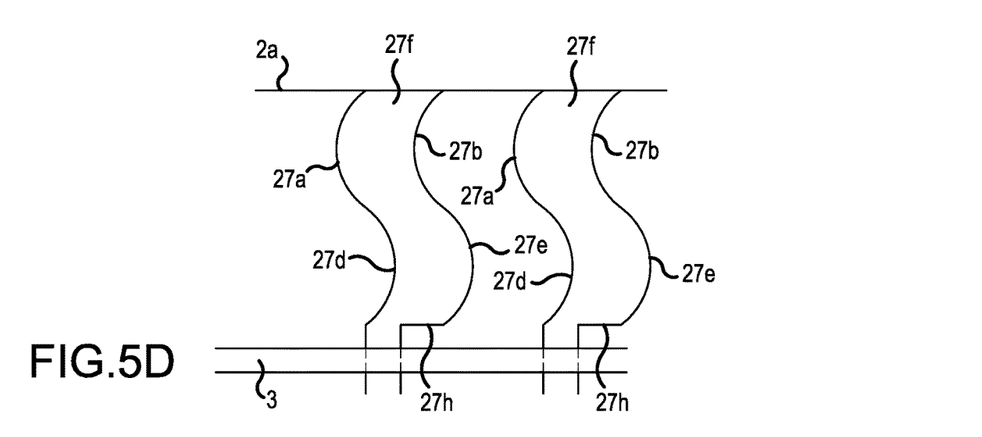

As illustrated in FIG. 5C, a curved inclined portion 27c may be formed by a pair of curved end surfaces 27a and 27b which swell to the left side. In addition, as illustrated in FIG. 5D, an S-shaped inclined portion 27f may be formed by the curved end surfaces 27a and 27b and curved end surfaces 27d and 27e which are curved in a direction opposite to the direction in which the curved end surfaces 27a and 27b are curved. Here, for the inclined portions 27c and 27f illustrated in FIGS. 5C and 5D, the curved end surfaces 27a and 27b or 27d and 27e may be inclined along a surface which is inclined with respect to the end surface 2a, and a step portion 27h may be formed. In FIGS. 5A-D, since the lead portions protrude or are curved in the same direction, adjacent lead portions can be arranged at equal intervals. Therefore, it is possible to reduce the gap between adjacent lead portions and thus reduce the size of the overall structure.

The shape of the lead portions which protrude or are curved in the same direction makes it possible to reduce component force in the direction in which the lead portion comes off to the end surface 2a forming the opening region 2 due to vibration force during the ultrasonic bonding of bonding wires. Therefore, it is possible to prevent the lead portion from coming off to the end surface 2a. In addition, since the step portions 25d, 26f, and 27h are formed, it is possible to prevent the movement of the lead portions to the outside of the frame body 3 due to vibration force during the ultrasonic bonding of the bonding wires.

Figure 6A:
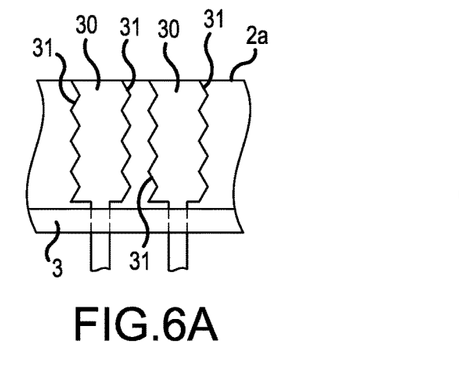
FIGS. 6A, 6B, 6C, 6D, 6E, and 6F are diagrams illustrating modifications of the lead portion.
Figure 6B:
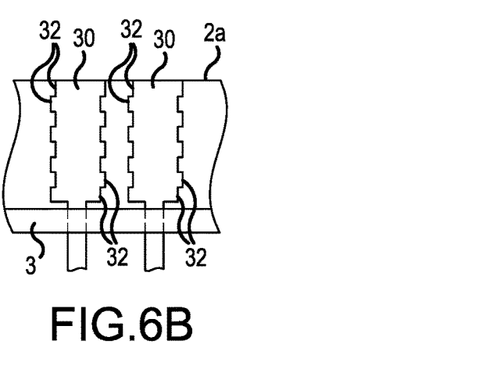

In the above-described embodiments, the overall shape of the lead portion forming the inclined portion is a dogleg shape or a curved shape. However, the invention is not limited thereto. For example, as illustrated in FIGS. 6A-F, a rectangular plate portion 30 which extends forward from the end surface 2a of the opening region 2 in a direction perpendicular to the end surface 2a may be formed and uneven portions or curved portions may be formed on the left and right sides of the rectangular plate portion 30. That is, as illustrated in FIG. 6A, uneven portions 31 with a triangular wave shape may be formed on the left and right sides of the rectangular plate portion 30. Alternatively, as illustrated in FIG. 6B, uneven portions 32 with a square wave shape in which phases are inverted in the left-right direction may be formed on the left and right sides of the rectangular plate portion 30. In this case, it is possible to reduce component force in the direction in which the lead portion comes off to the end surface 2a forming the opening region 2 due to vibration force during the ultrasonic bonding of the bonding wires. Therefore, it is possible to prevent the lead portion from coming off to the end surface 2a.

Figure 6C:
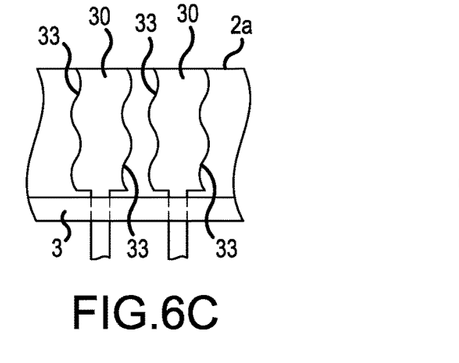
Figure 6D:
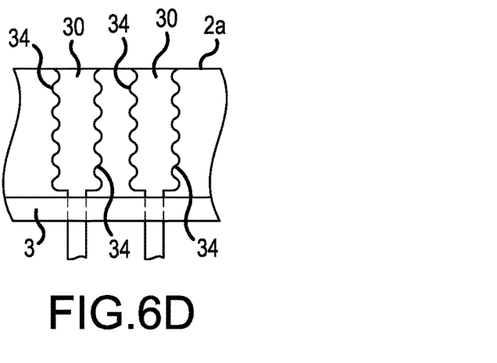
Figure 6E:
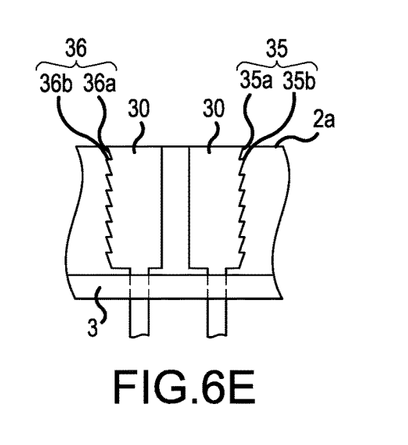
Figure 6F:
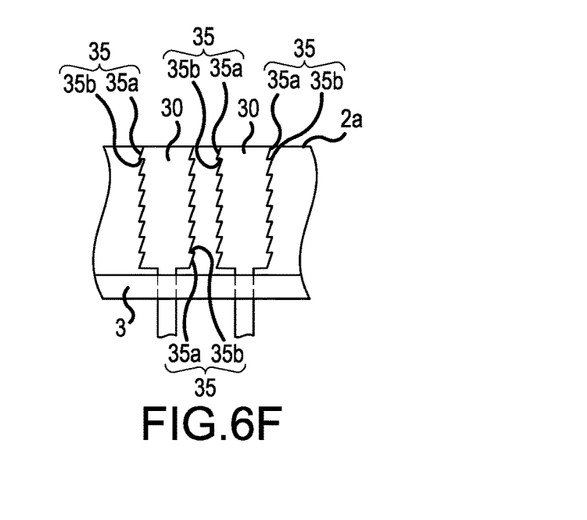

As illustrated in FIG. 6C, curved portions 33 with a sine wave shape may be formed in the same phase on the left and right sides of the rectangular plate portion 30. Alternatively, as illustrated in FIG. 6D, curved portions 34 with a sine wave shape which has a smaller cycle than that illustrated in FIG. 6C may be symmetrically formed on the left and right sides. As illustrated in FIG. 6E, uneven portions 35 and 36 with a sawtooth shape may be formed on the left or right side of the rectangular plate portions 30. Here, in the sawtooth-shaped uneven portion 35, an inclined extension portion 35a which obliquely extends from the end surface 2a to the antero-medial side and a step portion 35b which extends from the leading end of the inclined extension portion 35a to the outside are continuously formed. The sawtooth-shaped uneven portion 36 and the sawtooth-shaped uneven portion 35 are symmetric with respect to the vertical direction. In this case, as illustrated in FIG. 6E, for the sawtooth-shaped uneven portions 35 and 36, the sawtooth-shaped uneven portions 35 and 36 of adjacent lead portions may be arranged so as not to face each other. Alternatively, the sawtooth-shaped uneven portions 35 and 36 of adjacent lead portions may be arranged so as to face each other, which is not illustrated. Furthermore, as illustrated in FIG. 6F, the sawtooth-shaped uneven portions 35 illustrated in FIG. 6E may be formed on the left and right sides. In FIGS. 6E and 6F, since the step portion 35b and the step portion 36b are formed, it is possible to reduce component force in the direction in which the lead portion comes off to the end surface 2a forming the opening region 2 due to vibration force during the ultrasonic bonding of the bonding wires. Therefore, it is possible to prevent the lead portion from coming off to the end surface 2a.

In FIGS. 6A, 6B, 6C, and 6F, since the lead portions include the uneven portions 31, 32, 33, and 35 which are inclined or curved in the same direction, adjacent lead portions can be arranged at equal intervals. Therefore, it is possible to reduce the gap between adjacent lead portions and thus reduce the size of the overall structure. In FIGS. 6A-F, the uneven portions 31 to 36 are continuously formed in the front-rear direction. However, the invention is not limited thereto. A straight portion or an uneven portion with a different shape may be formed in the middle of the uneven portion. In FIGS. 6A-F, each of the uneven portions 31 to 36 is formed on the side of the rectangular plate portion 30. However, each of the uneven portions 31 to 36 may be formed in a plate portion which obliquely extends in a direction that intersects the end surface 2a of the opening region 2, instead of the rectangular plate portion 30.

The inclined portion can be formed in any shape as long as it can suppress the movement of the lead portion into the opening region 2 due to vibration in the front-rear direction when the bonding wires are bonded by the ultrasonic welder. The R-chamfered portion 15f of the dogleg end surface in the second embodiment can be applied to each of the corners of the lead portions 5a to 5d and 15a to 15e in the first and second embodiments.

Embodiments of the invention can be applied to a semiconductor device that is used for any device, such as a power conversion inverter device or a high-frequency switching IC.

The invention claimed is:

1. A semiconductor device comprising:
a frame body having an opening region;
an insulating substrate disposed in the opening region of the frame body and including a semiconductor chip;
a first lead portion including a first plate portion that is at least partially exposed to the opening region of the frame body and that extends from an end surface forming the opening region, the first plate portion including a top surface and a first lateral side and a second lateral side extending away from the top surface in a thickness direction of the first plate portion, and a plurality of uneven portions are formed on at least the first lateral side of the first plate portion;
a second lead portion disposed adjacent to the first lead portion and including a second plate portion that is at least partially exposed to the opening region of the frame body and that extends from the end surface forming the opening region, the second plate portion including a top surface and a first lateral side and a second lateral side extending away from the top surface in a thickness direction of the second plate portion, and a plurality of uneven portions are formed on at least the second lateral side of the second plate portion such that the plurality of uneven portions formed on the first lateral side of the first plate portion directly face the plurality of uneven portions formed on the second lateral side of the second plate portion with a concave portion of the plurality of uneven portions formed on the first lateral side of the first plate portion being directly aligned with a convex portion of the plurality of uneven portions formed on the second lateral side of the second plate portion; and
an ultrasonic-bonded wire connecting the lead portion and the semiconductor chip.

2. The semiconductor device according to claim 1, wherein the plurality of uneven portions of the first plate portion extend in a direction in which a vibration component is suppressed during ultrasonic bonding of the ultrasonic-bonded wire.

3. The semiconductor device according to claim 1, wherein the plurality of uneven portions formed on the first lateral side of the first plate portion have a square wave shape.

4. The semiconductor device according to claim 1, wherein the plurality of uneven portions formed on the first lateral side of the first plate portion have a saw-tooth shape.

5. The semiconductor device according to claim 1, wherein the plurality of uneven portions formed on the first lateral side of the first plate portion have a sine wave shape.

6. The semiconductor device according to claim 1, wherein the first lead portion further includes a terminal portion that extends outside of the frame body, the first plate portion of the first lead portion being a pad for the ultrasonic-bonded wire, and the first plate portion of the lead portion having a width that exceeds a width of the terminal portion of the first lead portion.

7. The semiconductor device according to claim 1, wherein the first plate portion and the second plate portion are arranged parallel to each other.

* * * * *